(12) United States Patent
Legoff et al.

(10) Patent No.: US 10,892,294 B2
(45) Date of Patent: Jan. 12, 2021

(54) RADIATION DETECTOR ELEMENT AND IMAGER COMPRISING AN ASSEMBLY OF RADIATION DETECTOR ELEMENTS

(71) Applicants: THALES, Courbevoie (FR); Commissariat à l'énergie atomique et aux énergies alternatives, Paris (FR)

(72) Inventors: Florian Legoff, Palaiseau (FR); Jean-Luc Reverchon, Palaiseau (FR); Christophe Kazmierski, Palaiseau (FR); Jean Decobert, Palaiseau (FR)

(73) Assignees: THALES, Courbevoie (FR); COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 156 days.

(21) Appl. No.: 16/062,884

(22) PCT Filed: Dec. 16, 2016

(86) PCT No.: PCT/EP2016/081514
§ 371 (c)(1),
(2) Date: Jun. 15, 2018

(87) PCT Pub. No.: WO2017/103161
PCT Pub. Date: Jun. 22, 2017

(65) Prior Publication Data
US 2018/0366511 A1    Dec. 20, 2018

(30) Foreign Application Priority Data
Dec. 16, 2015 (FR) .................................. 15 02616

(51) Int. Cl.
*H01L 25/00* (2006.01)
*H01L 27/146* (2006.01)
*H01L 31/101* (2006.01)

(52) U.S. Cl.
CPC .... *H01L 27/14649* (2013.01); *H01L 27/1469* (2013.01); *H01L 27/14601* (2013.01);
(Continued)

(58) Field of Classification Search
CPC ......... H01L 27/14649; H01L 27/14652; H01L 27/14601; H01L 27/14694; H01L 31/101;
(Continued)

(56) References Cited

U.S. PATENT DOCUMENTS 5,144,138 A    9/1992    Kinch et al.
5,608,230 A    3/1997    Hirayama et al.
(Continued)

FOREIGN PATENT DOCUMENTS

EP    2 432 034    3/2012
EP    2507835      10/2012
(Continued)

OTHER PUBLICATIONS

Tropf et al., "Infrared optical materials", 1996, SPIE Proceedings, vol. 10286, pp. 102860A-1 to 102860A-33 (Year: 1996).*
(Continued)

*Primary Examiner* — Kiho Kim
(74) *Attorney, Agent, or Firm* — Nixon & Vanderhye

(57) ABSTRACT

The invention relates to a radiation detector element (10) comprising a stack (15) of layers superimposed in a stacking direction (Z), the stack (15) having a first face (25) and a second face (30) and comprising a radiation-absorbing layer (35) consisting of a first semiconductor material (M1) having a first band gap value and at least one barrier layer (40) consisting of a second semiconductor material (M2) having a second band gap value, the second band gap value being strictly higher than the first band gap value. The second face (30) has at least one strip (105) defined in the stacking direction (Z) by the barrier layer (40), the strip (105) consisting of the second semiconductor material (M2) and having a doping of the first type and a free carrier density higher than or equal to 1.1017 cm−3.

20 Claims, 4 Drawing Sheets

(52) U.S. Cl.
CPC .. *H01L 27/14634* (2013.01); *H01L 27/14636* (2013.01); *H01L 27/14638* (2013.01); *H01L 27/14641* (2013.01); *H01L 27/14647* (2013.01); *H01L 27/14652* (2013.01); *H01L 27/14694* (2013.01); *H01L 31/101* (2013.01); *H01L 27/14603* (2013.01)

(58) Field of Classification Search
CPC ........... H01L 27/1469; H01L 27/14634; H01L 27/14638; H01L 27/14647; H01L 27/14641; H01L 27/14636; H01L 27/14603
See application file for complete search history.

(56) References Cited

U.S. PATENT DOCUMENTS

| | | |
|---|---|---|
| 8,299,497 B1 | 10/2012 | Klem et al. |
| 9,245,915 B2 | 1/2016 | Giffard et al. |
| 9,379,158 B2 | 6/2016 | Giffard et al. |
| 9,880,057 B2 | 1/2018 | Cazaux et al. |
| 2009/0261442 A1 | 10/2009 | Grein et al. |
| 2010/0032652 A1* | 2/2010 | Okamura .......... H01L 31/03046 257/21 |
| 2012/0273838 A1 | 11/2012 | Kinch et al. |
| 2013/0214161 A1 | 8/2013 | Cazaux et al. |
| 2013/0284889 A1 | 10/2013 | Giffard et al. |
| 2014/0346356 A1 | 11/2014 | Giffard et al. |

FOREIGN PATENT DOCUMENTS

| | | |
|---|---|---|
| FR | 2966976 | 5/2012 |
| FR | 2966978 | 5/2012 |
| FR | 2 983 348 | 5/2013 |
| WO | WO 2013079603 | 6/2013 |

OTHER PUBLICATIONS

International Search Report, PCT/EP2016/081514, dated Feb. 16, 2017.
French Search Report, FR1502616, dated Sep. 15, 2016.
Article I.M Baker et. al. « Fourth international conference on advanced infrared detectors and systems », 1990, pp. 78 to 87.

* cited by examiner

US 10,892,294 B2

RADIATION DETECTOR ELEMENT AND IMAGER COMPRISING AN ASSEMBLY OF RADIATION DETECTOR ELEMENTS

FIELD OF THE INVENTION

The present invention relates to a radiation detector element, as well as an imager comprising a set of radiation detector elements.

BACKGROUND OF THE INVENTION

Generally, electromagnetic radiation detector devices comprise a matrix of individual radiation detector elements. Such radiation detector devices, also called "imagers", further comprise a reading circuit able to receive an electrical signal from each radiation detector element. The imager is able to reconstitute a two-dimensional image from electrical signals provided by each detector element.

The radiation detector elements used are frequently made from semi-conductive materials. For example, silicon radiation detector elements of the CCD (Charge-Coupled Device) or CMOS (Complementary Metal-Oxide-Semiconductor) type are used in digital cameras capable of detecting visible electromagnetic radiation. For other radiation ranges, such as infrared radiation, other types of radiation detector elements are used, for example comprising photodiodes.

The photodiode detector elements comprise a layer capable of absorbing radiation, made from a semiconductor material. The absorbing layer comprises a p/n junction formed from the juxtaposition of a portion of p-type material and a portion of n-type material. Such a p/n junction generates an electrical field in the absorbing layer. When a photon is absorbed, it generates an electron-hole pair in the absorbing layer. The electrical field exerts a force on the electron and the hole that separates the electron-hole pair, and leads to an electric current. The electric current is next detected by a dedicated reading circuit.

Known from the article by I. M Baker, titled "Hybrid CdHgTe-Silicon infrared focal plane arrays" and which appeared in 1990 in "Fourth International Conference on Advanced Infrared Detectors and Systems", pages 78 to 87, is a detector element of this type, comprising a semiconducting absorbing layer traversed by an electrode. The electrode is surrounded by a first portion of the absorbing layer having an n-type doping. A second portion of the absorbing layer has a p-type doping. The first portion is cylindrical, and forms, with the second portion, an n/p junction surrounding the electrode. Such a geometry of the detector elements is called "loop-hole".

During the operation of a detector element, the electric current successively traverses an electrode, the first portion, the p/n junction, then the second portion before rejoining the reading circuit.

However, such detector elements often have a significant resistance to the passage of the current. For example, the detector element has a resistance of the order of $10^{11}$ Ohm ($\Omega$) to $10^{14}\Omega$, which is added to a so-called access resistance of the order of $10^{6}\Omega$ between the detector element and the electric contact. As a result, when an imager comprises several detector elements sharing a shared electric contact, the detector elements do not all have the same electrical resistance to the passage of the current. In particular, the electrical resistance increases with the distance between the detector element and the electric contact. This phenomenon is frequently called "depolarization".

In order to limit depolarization, the second portion is generally electrically connected to the reading circuit by a metal layer placed on its surface. However, the metal layer generally absorbs part of the radiation to be detected. The performance of the detector element is therefore not optimized.

There is therefore a need for a radiation detector element having a better performance.

SUMMARY OF THE INVENTION

To that end, a radiation detector element is proposed comprising:
  a stack of layers superimposed in a stacking direction, the stack having a first face and a second face and comprising a radiation-absorbing layer consisting of a first semiconductor material having a first band gap value and at least one barrier layer consisting of a second semiconductor material having a second band gap value, the second band gap value being strictly greater than the first band gap value; and
  a reading circuit delimited in the stacking direction by the first face;
  the absorbing layer comprising a first portion having a doping of a first type chosen from among n-type doping and p-type doping, and a second portion having a doping of a second type chosen from among n-type doping and p-type doping, the second type of doping being different from the first type of doping, the first portion and the second portion forming a first p-n junction;
  the stack further delimiting a primary hole traversing each of the layers of the stack, the primary hole receiving at least part of a primary electrode electrically connecting the first portion to the reading circuit and traversing the first face, the first p-n junction surrounding the primary electrode in a plane orthogonal to the stacking direction, and
  the second face carrying at least one band delimited in the stacking direction by the barrier layer, the band being made from the second semiconductor material and having a doping of the first type and a free carrier density greater than or equal to $1.10^{17}$ cm$^{-3}$.

According to one specific embodiment, the detector element comprises one or more of the following features, considered alone or according to any technically possible combination(s):
  the band is made from a degenerated semiconductor material.
  the band surrounds the primary electrode in a plane orthogonal to the stacking direction.
  the stack further comprises at least one intermediate layer made from a third semiconductor material having a third band gap value comprised between the first band gap value and the second band gap value, the intermediate layer being delimited, in the stacking direction, by the absorbing layer and the barrier layer.
  the third material is a quaternary material at least formed from the first material and the second material.
  the first material is chosen from among InGaAs, InAsSb and InSb, and when the first material is InGaAs, the second material is InP; when the first material is InAsSb, the second material is AlGaAsSb; and when the first material is InSb, the second material is InAlSb.
  the detector element further includes a passivation layer surrounding the primary electrode in a plane orthogonal to the stacking direction, the passivation layer being delimited in the plane orthogonal to the stacking direction by the primary electrode and by the barrier layer, the passivation layer being able to electrically isolate the barrier layer from the primary electrode.

the primary hole is cone-shaped with a circular base.

Also proposed is an imager comprising at least one second set of radiation detector elements as defined above, in which each band is electrically connected to at least one other band, the bands forming, on the second face, a two-dimensional array having a plurality of meshes, each mesh surrounding, in a plane orthogonal to the stacking direction, a single primary electrode.

According to one particular embodiment, the imager comprises a collection layer made from the second material and partly covering the second face, the device further comprising a first set of secondary holes, each secondary hole traversing the collection layer and at least partially receiving a first electrode traversing the first face and electrically connecting the collection layer to the reading circuit.

Also proposed is a radiation detection element comprising a stack of layers superimposed in a stacking direction, the stack having a first face and a second face and having a radiation-absorbing layer consisting of a first semiconductor material having a first band gap value and at least one barrier layer consisting of a second semiconductor material having a second band gap value, the second band gap value being strictly greater than the first band gap value. The radiation detector element comprises a reading circuit delimited in the stacking direction by the first face. The absorbing layer comprises a first portion having a doping of a first type chosen from among n-type doping and p-type doping, and a second portion having a doping of a second type chosen from among n-type doping and p-type doping, the second type of doping being different from the first type of doping, the first portion and the second portion forming a first p-n junction. The barrier layer includes a first conducting zone having a doping of the first type, the first conducting zone and the first portion being superimposed. The stack delimits a primary hole traversing each of the layers of the stack, the primary hole receiving at least part of a primary electrode electrically connecting the first portion to the reading circuit and traversing the first face, the first p/n junction surrounding the primary electrode in a plane orthogonal to the stacking direction, and the first conducting zone has a free carrier density greater than or equal to $1.10^{17}$ cm$^{-3}$.

According to one specific embodiment, the detector element comprises one or more of the following features, considered alone or according to any technically possible combination(s):

the first conducting zone is made from a degenerated semiconductor material.

the stack further comprises at least one intermediate layer made from a third semiconductor material having a third band gap value comprised between the first band gap value and the second band gap value, the intermediate layer being delimited, in the stacking direction, by the absorbing layer and the barrier layer.

the third material is a quaternary material at least formed from the first material and the second material.

the barrier layer includes a second conducting zone having a doping of the second type, the first conducting zone and the second conducting zone forming a second p/n junction surrounding the primary electrode in a plane orthogonal to the stacking direction and the second conducting zone being in contact with the primary electrode.

the first material is chosen from among InGaAs, InAsSb and InSb, and when the first material is InGaAs, the second material is InP; when the first material is InAsSb, the second material is AlGaAsSb; and when the first material is InSb, the second material is InAlSb.

the detector element further includes a passivation layer surrounding the primary layer in a plane orthogonal to the stacking direction, the passivation layer being delimited in the plane orthogonal to the stacking direction by the primary electrode and by the barrier layer, the passivation layer being able to electrically isolate the barrier layer from the primary electrode;

the detector element further includes a filtering layer able to allow the propagation of at least one electromagnetic wave having a first energy comprised in a primary set of energies and to prevent the propagation of at least one electromagnetic wave having a second energy comprised in a secondary set of energies, the secondary set being different from the primary set, the filtering layer being delimited in the stacking direction by the second face.

the primary hole is cone-shaped with a circular base.

the first conducting zone has a spatial doping gradient in the stacking direction.

Also proposed is an imager comprising at least one second set of radiation detector elements as previously defined, the imager further comprising a first set of secondary holes each receiving at least part of a secondary electrode electrically connecting the first conducting zone to the reading circuit and traversing the first face, each of the secondary holes of the first set being arranged along a specific line of the first set, and the specific line surrounding the second set in a plane orthogonal to the stacking direction.

BRIEF DESCRIPTION OF THE DRAWINGS

Features and advantages of the invention will appear more clearly upon reading the following description, provided solely as a non-limiting example, and done in reference to the appended drawings, in which.

DETAILED DESCRIPTION OF PREFERRED EMBODIMENTS

Figure 1:
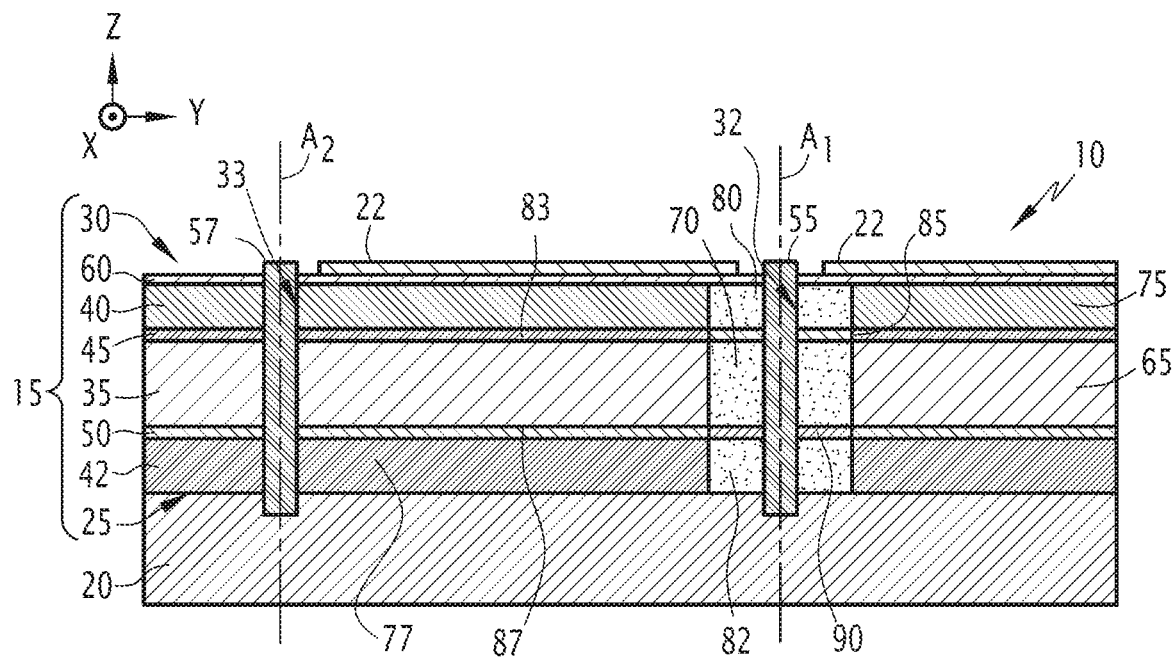
FIGS. 1 to 3 are sectional views of a radiation detector element.

A first example radiation detector element 10 is shown in FIG. 1.

The detector element 10 is able to generate an electrical signal S when the detector element 10 absorbs radiation R.

The radiation R comprises at least one electromagnetic wave Oe.

The electromagnetic wave Oe has at least an energy E and an amplitude A.

The energy E is defined as the product of the Planck constant h and the frequency f of the electromagnetic wave Oe in a vacuum.

The amplitude A is defined as the Euclidian norm of the electric field of the electromagnetic wave Oe.

The electrical signal S is an electric current. For example, the electrical signal S is an electric current proportional to the amplitude A of the electromagnetic wave Oe.

The radiation detector element 10 comprises a stack 15 of superimposed layers and a reading circuit 20. Optionally, as is the case for the example of FIG. 1, the detector element 10 also comprises a filtering layer 22.

The stack 15 comprises a plurality of layers superimposed in a stacking direction Z.

The stack 15 has a first face 25 and a second face 30, and delimits a primary hole 32 and a secondary hole 33.

The stack 15 is delimited in the stacking direction Z by the first face 25 and the second face 30.

The stack 15 comprises an absorbing layer 35, a first barrier layer 40, a second barrier layer 42, a first intermediate layer 45, a second intermediate layer 50, a primary electrode 55, a secondary electrode 57 and a passivation layer 60.

The reading circuit 20 is configured to generate the electrical signal S in response to an electric current C received from the primary electrode 55.

The reading circuit 20 is delimited in the stacking direction Z by the first face 25. The reading circuit 20 is electrically connected to the primary electrode 55.

The filtering layer 22 is able to allow the propagation, in the stacking direction Z, of at least one electromagnetic wave Oe having an energy E comprised in a primary set En1 of energies.

The filtering layer 22 is able to prevent the propagation, in the stacking direction Z, of at least one electromagnetic wave Oe having an energy E comprised in a secondary set En2 of energies.

The secondary set En2 is different from the primary set En1. This means that there is at least one energy E comprised in the primary set En1, and which is not comprised in the secondary set En2.

The filtering layer 22 has a first thickness e1 in the stacking direction Z.

The filtering layer 22 is planar.

This means that the first thickness e1 is uniform. The expression "uniform thickness" of the layer means that, when the thickness is defined as the length of the segment parallel to the stacking direction Z and connecting a first point of a first surface of the layer to a second point of a second surface of the layer, the thickness is unchanged, to within ten percent, when the position of the first point on the first surface is modified.

The layer further has a width in a first direction X perpendicular to the stacking direction, and a length in a second direction Y perpendicular to the first direction X and the stacking direction Z. The term "planar layer" also means that the length and the width of the filtering layer are each strictly greater than ten times the first thickness e1.

The filtering layer 22 is perpendicular to the stacking direction Z. This means that the first direction of the filtering layer 22 is the stacking direction Z.

The filtering layer 22 is delimited in the stacking direction Z by the passivation layer 60.

The filtering layer 22 includes a stack of dielectric layers. For example, the filtering layer 22 is a Bragg grating, i.e., a stack of dielectric layers with different optical indices such as titanium oxide TiO2 and silicon oxide SiO2.

Alternatively, the filtering layer 22 is a layer of a filled polymer material. For example, the filtering layer 22 is made from a polyimide comprising fillers of an aromatic compound having a specific absorption spectrum.

The primary hole 32 traverses each of the layers of the stack 15.

The primary hole 32 receives at least part of the primary electrode 55.

The primary hole 32 is cylindrical with a circular base.

The primary hole 32 has a first axis A1.

The first axis A1 is preferably parallel to the stacking direction Z.

The secondary hole 33 traverses each of the layers of the stack 15. The secondary hole 33 receives at least part of the secondary electrode 57.

In FIG. 1, the secondary hole 33 is cylindrical with a circular base.

The secondary hole 33 has a second axis A2. The second axis A2 is preferably parallel to the stacking direction Z.

The absorbing layer 35 is able to absorb at least part of the radiation R.

The absorbing layer 35 can be made from a first semiconductor material M1 having a first band gap value G1.

"Band gap value" of a material refers to the value of the width of the band gap between the valence band and the conduction band in the material. The band gap value of a material is for example expressed in electron-volts (eV).

The valence band is defined as being, from among the energy bands allowed for an electron in the material, the band that has the highest energy while being completely filled at a temperature of less than or equal to 20 kelvins (K).

The conduction band is defined as being, from among the energy bands allowed for an electron in the material, the band that has the lowest energy while not being filled at a temperature of less than or equal to 20 K.

"Semiconductor material" refers to a material having a band gap value strictly greater than zero and less than or equal to 6.5 eV.

The first material M1 is for example a binary material such as indium antimonide InSb.

Alternatively, the first semiconductor material is a ternary material such as indium gallium arsenide InGaAs or indium arsenide antimonide InAsSb.

The absorbing layer 35 comprises a first portion 65 and a second portion 70.

The absorbing layer 35 is planar. The absorbing layer 35 is preferably perpendicular to the stacking direction Z.

The absorbing layer 35 is delimited, in the stacking direction Z, by the first intermediate layer 45 and the second intermediate layer 50.

The absorbing layer 35 has a second thickness e2 in the stacking direction Z. The second thickness e2 is for example comprised between 1 μm and 3 μm.

The first portion 65 has a doping of the first type.

Doping is defined as the presence, in a material, of impurities contributing free charge carriers. The impurities are for example atoms of an element that is not naturally present in the material.

When the presence of impurities increases the hole density in the material relative to the non-doped material, the doping is p-type doping. For example, an InP layer is p-doped by adding zinc atoms.

When the presence of impurities increases the free electron density in the material relative to the non-doped material, the doping is n-type doping. For example, an InP layer is n-doped by adding sulfur atoms.

The first type of doping is chosen from among n-doping and p-doping.

For example, the first type of doping is n-doping.

The first portion 65 has a first carrier density d1.

The carrier density is defined, for an n-doped material, as the number of free electrons in the material per unit of volume.

The carrier density is defined, for a p-doped material, as the number of holes per unit of volume.

The first carrier density d1 is uniform. This means that, if the first carrier density d1 is measured, for example by electron tomography, in different locations of the first portion 65, the measured value varies by at least ten percent depending on the location in the first portion 65 where the measurement is done.

The first carrier density d1 is for example equal to $5.10^{18}$ per cubic centimeter ($/cm^3$), where "." designates the multiplication mathematical operation.

The first portion 65 is annular with a circular base. The first portion 65 is annular around the first axis A1.

The first portion 65 surrounds, in a plane perpendicular to the second direction Z, the second portion 70 and the primary electrode 55.

The second portion 70 has a doping of a second type.

The second type of doping is chosen from among n-doping and p-doping. The second type of doping is different from the first type of doping.

When the first portion 65 has n-doping, the second portion 70 has p-doping. When the first portion 65 has p-doping, the second portion 70 has n-doping.

The first portion 65 is annular with a circular base. The first portion 65 has a symmetry of revolution around the first axis A1.

The second portion 70 has a second carrier density d2.

The second carrier density d2 is for example comprised strictly between $5.10^{13}/cm^3$ and $1.10^{16}/cm^3$.

The second portion 70 is cylindrical with a circular base. The second portion 70 has a symmetry of revolution around the first axis A1.

The second portion 70 surrounds, in a plane perpendicular to the stacking direction Z, the primary electrode 55.

The first portion 65 and a second portion 70 form a first p/n junction J1.

A p/n junction is defined as being the interface between two portions of semiconductor material respectively having p-doping and n-doping.

The first p/n junction J1 surrounds, in a plane perpendicular to the stacking direction Z, the primary electrode 55.

For example, the first p/n junction J1 is cylindrical with a circular base around the first axis A1.

The first p/n junction J1 generates a first electric field C1.

The first barrier layer 40 is able to isolate the absorbing layer 35 from the outside. The first barrier layer 40 is further able to prevent a charge carrier from joining the second face 30 from the absorbing layer 35.

The first barrier layer 40 is made from a second semiconductor material M2.

The second semiconductor material M2 has a second band gap value G2. The second band gap value G2 is strictly greater than the first band gap value G1.

For example, when the first material M1 is InGaAs, the second material M2 is indium phosphide InP.

Alternatively, when the first material M1 is InAsSb, the second material M2 is aluminum gallium arsenide antimonide AlGaAsSb.

In another alternative, when the first material M1 is InSb, the second material M2 is indium aluminum antimonide InAlSb.

The first barrier layer 40 is planar. The first barrier layer 40 is preferably perpendicular to the stacking direction Z.

The first barrier layer 40 is delimited, in the stacking direction Z, by the first intermediate layer 45 and the passivation layer 60.

The first barrier layer 40 has a third thickness e3 in the stacking direction Z. The third thickness e3 is for example comprised between 50 nanometers (nm) and 1 μm, for example equal to 300 nm.

The first barrier layer 40 includes a first conducting zone 75 and a second conducting zone 80.

The first conducting zone 75 is annular with a circular base. The first conducting zone 75 has a circular symmetry around the first axis A1.

The first conducting zone 75 surrounds, in a plane perpendicular to the stacking direction Z, the second conducting zone 80 and the primary electrode 55.

The first conducting zone 75 and the first portion 65 are superimposed.

The first conducting zone 75 has a doping of the first type.

The first conducting zone 75 has a third carrier density d3.

The third carrier density d3 is for example uniform. The third carrier density d3 is greater than or equal to $10^{17}/cm^3$.

Alternatively, the first conducting zone 75 is made from a second degenerated semiconductor material M2.

This means that the first conducting zone 75 is highly doped and has the same electrical characteristics as a conducting material. In particular, the electrical conductivity of the first conducting zone 75 does not vary based on the temperature.

For example, when the first conducting zone 75 is made from InP and is n-doped, the first conducting zone 75 is degenerated when the third carrier density d3 is greater than or equal to $2.10^{17}/cm^3$.

Alternatively, the first conducting zone 75 has a doping gradient in the stacking direction Z. This means that the third carrier density d3 varies monotonously in the stacking direction Z.

Preferably, the third carrier density d3 increases, in the stacking direction Z, moving away from the absorbing layer 35.

For example, the third carrier density d3 is equal, at the interface between the first conducting zone 75 and the first intermediate layer 45, to $2.10^{16}/cm^3$, and is equal to $5.10^{17}/cm^3$ at the interface between the first conducting zone 75 and the passivation layer 60.

The first conducting zone 75 is electrically connected to the reading circuit 20 via the secondary electrode 57.

The second conducting zone 80 has a doping of the second type.

The second conducting zone 80 has a fourth carrier density d4.

For example, the fourth carrier density d4 is comprised strictly between $1.10^{16}/cm^3$ and $5.10^{18}/cm^3$.

The second conducting zone 80 is annular with a circular base. The second conducting zone 80 has a circular symmetry around the first axis A1.

The second conducting zone 80 surrounds, in a plane perpendicular to the stacking direction Z, the primary electrode 55.

The second conducting zone 80 and the second portion 70 are superimposed.

The first conducting zone 75 and the second conducting zone 80 form a second p/n junction J2.

The second p/n junction J2 surrounds the primary electrode 55 in a plane perpendicular to the stacking direction Z.

The second barrier layer 42 is able to isolate the absorbing layer 35 from the outside. The second barrier layer 42 is further able to prevent a charge carrier from joining the first face 25 from the absorbing layer 35.

The second barrier layer 42 is made from the second semiconductor material M2.

The second barrier layer 42 is planar.

The second barrier layer 42 is preferably perpendicular to the stacking direction Z.

The second barrier layer 42 is delimited in the stacking direction Z by the intermediate layer 50 and the first face 25.

The second barrier layer 42 has a fourth thickness e4 in the stacking direction Z. The fourth thickness e4 is comprised between 50 nm and 1 µm, for example equal to 300 nm.

The second barrier layer 42 includes a third conducting zone 77 and a fourth conducting zone 82.

The third conducting zone 77 is annular with a circular base. The third conducting zone 77 has a circular symmetry around the first axis A1.

The third conducting zone 77 surrounds, in a plane perpendicular to the stacking direction Z, the fourth conducting zone 82 and the primary electrode 55.

The third conducting zone 77 and the first portion 65 are superimposed.

The third conducting zone 77 has a doping of the first type.

The third conducting zone 77 has a fifth carrier density d5.

The fifth carrier density d5 is for example uniform.

For example, the fifth carrier density d5 is greater than or equal to $10^{17}/cm^3$.

Alternatively, the fifth carrier density d5 is equal to $2.10^{16}/cm^3$.

The fourth conducting zone 82 has a doping of the second type.

The fourth conducting zone 82 and the third conducting zone 77 form a third p/n junction J3. The third p/n junction J3 surrounds, in a plane perpendicular to the stacking direction Z, the primary electrode 55.

The fourth conducting zone 82 has a sixth carrier density d6.

The sixth carrier density d6 is for example comprised strictly between $1.10^{16}/cm^3$ and $1.10^{18}/cm^3$.

The fourth conducting zone 82 and the second portion 70 are superimposed.

The fourth conducting zone 82 is annular with a circular base. The fourth conducting zone 82 has a circular symmetry around the first axis A1.

The fourth conducting zone 82 surrounds, in a plane perpendicular to the stacking direction Z, the primary electrode 55.

The first intermediate layer 45 is able to facilitate the transfer of the charge carriers from the absorbing layer 35 to the first barrier layer 40. This means that, when a difference in electric potential is applied between the absorbing layer 35 and the first barrier layer 40, the measured electric resistance is less than the measured electric resistance without the first intermediate layer 45.

The first intermediate layer 45 is planar. The first intermediate layer 45 is preferably perpendicular to the stacking direction Z.

The first intermediate layer 45 is delimited, in the stacking direction Z, by the absorbing layer 35 and the first barrier layer 40.

The first intermediate layer 45 has a fifth thickness e5 in the stacking direction Z.

The fifth thickness e5 is comprised strictly between 10 nm and 50 nm.

The first intermediate layer 45 is made from a third semiconductor material M3.

The third semiconductor material M3 has a third band gap value G3.

The third band gap value G3 is strictly greater than the first band gap value G1.

The third band gap value G3 is strictly less than the second band gap value G2.

Preferably, the third material M3 is formed from the first material M1 and the second material M2.

For example, when the first material M1 is InGaAs, the second material M2 is InP, the third material M3 is the quaternary material indium gallium arsenide phosphide InGaAsP.

The first intermediate layer 45 includes a first intermediate zone 83 and a second intermediate zone 85.

The first intermediate zone 83 has a doping of the first type.

The first intermediate zone 83 has a seventh carrier density d7.

The seventh carrier density d7 is for example comprised strictly between $1.10^{14}/cm^3$ and $1.10^{17}/cm^3$.

The first intermediate zone 83 and the first portion 65 are superimposed in the stacking direction Z.

The first intermediate zone 83 is annular with a circular base. The first intermediate zone 83 has a circular symmetry around the first axis A1.

The first intermediate zone 83 surrounds, in a plane perpendicular to the stacking direction Z, the second intermediate zone 85 and the primary electrode 55.

The second intermediate zone 85 has a doping of the second type.

The second intermediate zone 85 has a eighth carrier density d8.

The eighth carrier density d8 is for example comprised strictly between $1.10^{16}/cm^3$ and $5.10^{18}/cm^3$.

The second intermediate zone 85 and the second portion 70 are superimposed in the stacking direction Z.

The second intermediate zone 85 is annular with a circular base. The second intermediate zone 85 has a circular symmetry around the first axis A1.

The second intermediate zone 85 surrounds, in a plane perpendicular to the stacking direction Z, the primary electrode 55.

The first intermediate zone 83 and the second intermediate zone 85 form a fourth p/n junction J4.

The fourth p/n junction J4 surrounds, in a plane perpendicular to the stacking direction Z, the primary electrode 55.

The fourth p/n junction J4 is for example cylindrical with a circular base around the first axis A1.

The second intermediate layer 50 is able to facilitate the transfer of the charge carriers from the absorbing layer 35 to the second barrier layer 42. This means that, when a difference in electric potential is applied between the absorbing layer 35 and the second barrier layer 42, the electric resistance to the passage of the current is less than the measured electric resistance without the second intermediate layer 50.

The second intermediate layer 50 is planar.

Preferably, the second intermediate layer 50 is perpendicular to the stacking direction Z.

The second intermediate layer 50 is delimited in the stacking direction Z by the absorbing layer 35 and the second barrier layer 42.

The second intermediate layer 50 has a sixth thickness e6 in the stacking direction Z.

The second intermediate layer 50 is made from the third material M3.

The second intermediate layer 50 includes a third intermediate zone 87 and a fourth intermediate zone 90.

The third intermediate zone 87 has a doping of the first type.

The third intermediate zone 87 has a ninth carrier density d9.

The ninth carrier density d9 is for example comprised strictly between $1.10^{14}/cm^3$ and $5.10^{17}/cm^3$.

The third intermediate zone 87 and the first portion 65 are superimposed in the stacking direction Z.

The third intermediate zone 87 is annular with a circular base. The third intermediate zone 87 has a circular symmetry around the first axis A1.

The third intermediate zone 87 surrounds, in a plane perpendicular to the stacking direction Z, the fourth intermediate zone 90 and the primary electrode 55.

The fourth intermediate zone 90 has a doping of the second type.

The fourth intermediate zone 90 has a tenth carrier density d10.

The tenth carrier density d10 is for example comprised strictly between $1.10^{16}/cm^3$ and $5.10^{18}/cm^3$.

The fourth intermediate zone 90 is annular with a circular base. The fourth intermediate zone 90 has a circular symmetry around the first axis A1.

The fourth intermediate zone 90 surrounds, in a plane perpendicular to the stacking direction Z, the primary electrode 55.

The fourth intermediate zone 90 and the second portion 70 are superimposed in the stacking direction Z.

The third intermediate zone 87 and the fourth intermediate zone 90 form a fifth p/n junction J5.

The fifth p/n junction J5 surrounds the primary electrode in a plane perpendicular to the stacking direction Z.

The primary electrode 55 is able to connect the second conducting zone 80 electrically to the reading circuit 20. The primary electrode 55 is further able to connect the fourth conducting zone 82 electrically to the reading circuit 20.

The primary electrode 55 is made from a metal material.

The primary electrode 55 is for example made from platinum. Alternatively, the primary electrode 55 is made from titanium.

The primary electrode 55 is for example cylindrical with a circular base around the first axis A1.

The primary electrode 55 traverses the first face 25 and the second face 30. This means that the primary electrode 55 traverses each of the layers of the stack 15.

Alternatively, the primary electrode 55 does not traverse the second face 30.

The secondary electrode 57 is able to connect the first conducting zone 75 electrically to the reading circuit 20.

The secondary electrode 57 is further able to connect the third conducting zone 77 electrically to the reading circuit 20.

The secondary electrode 57 is made from a metal material.

The secondary electrode 57 is for example made from platinum. Alternatively, the secondary electrode 57 is made from titanium.

The secondary electrode 57 is for example cylindrical with a circular base. The axis of the secondary electrode 57 is the first axis A1.

Alternatively, the secondary electrode 57 is conical with a circular base.

The secondary electrode 57 traverses the first surface 25. In FIG. 1, the secondary electrode 57 further traverses the second face 30.

The passivation layer 60 is able to electrically isolate the first barrier layer 40 from the outside of the stack 15.

Preferably, the passivation layer 60 is further able to prevent the first barrier layer 40 from oxidizing in contact with the atmosphere.

The passivation layer 60 is planar. The passivation layer 60 is preferably perpendicular to the stacking direction Z.

In the stacking direction Z, the passivation layer 60 is delimited by the first barrier layer 40 and by the filtering layer 22.

The passivation layer 60 is made from a dielectric material Md such as silicon oxide $SiO_x$ or silicon nitride $SiN_x$.

The passivation layer 60 has a seventh thickness e7 in the stacking direction Z.

The operation of the detector element 10 will now be described.

An electric voltage U is applied between the primary electrode 55 and the secondary electrode 57. The voltage U makes it possible to compensate the dispersion of the transistors of the reading circuit 20.

The electric voltage U is for example one tenth of a Volt (V).

The radiation detector element 10 receives radiation R on the second face 30.

The radiation R comprises at least a first electromagnetic wave Oe1 and a second electromagnetic wave Oe2.

The first electromagnetic wave Oe1 has a first energy en1 comprised in the first set En1, and a first amplitude A1.

The second electromagnetic wave Oe2 has a second energy en2 comprised in the second set En2.

The first energy en1 is greater than or equal to the first band gap value G1, and strictly less than the second band gap value G2 and the third band gap value G3.

The first electromagnetic wave Oe1 propagates through the filtering layer 22, then traverses the passivation layer 60, the first barrier layer 40 and the first intermediate layer 45 before being absorbed by the absorbing layer 35.

The second electromagnetic wave Oe2 does not propagate through the filtering layer 22.

The absorption of the first electromagnetic wave Oe1 in the absorbing layer 35 generates an electron-hole pair (also called exciton).

The separation of the electron-hole pair by the first electric field C1 leads to an electric current C. Such an operating mode for the detector element 10 is called "photovoltaic mode".

The electric current C successively traverses the secondary electrode 57, the first conducting zone 75, the first intermediate zone 83, the first portion 65, the second portion 70 and the primary electrode 55.

The electric current C is detected by the reading circuit 20, which generates the electric signal S.

The first conducting zone 75, being highly doped, has a low resistance to the passage of the electric current C.

The detector element 10 therefore does not include a metal layer intended to conduct the current from the first barrier layer 40 to the secondary electrode 57. The detector element 10 therefore does not have losses related to the absorption of the radiation R in such a metal layer.

The performance of the detector element 10 is therefore improved.

Figure 2:
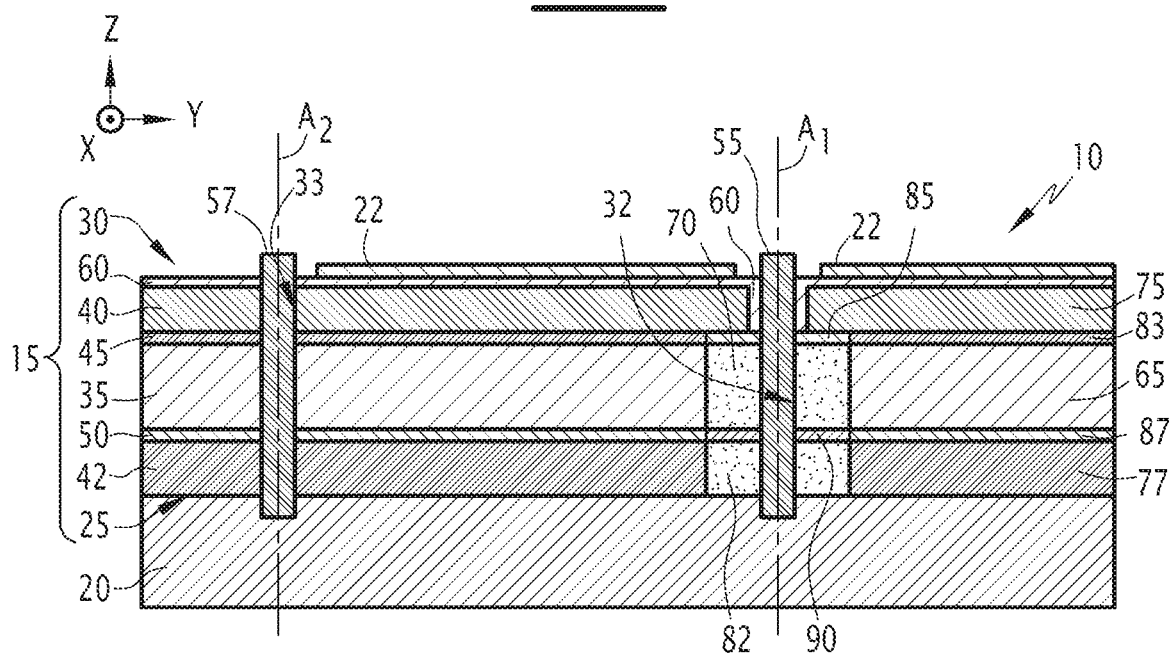

A second example detector element 10 is shown in FIG. 2. The elements identical to the first example of FIG. 1 are not described again. Only the differences are shown.

The first barrier layer 40 does not comprise a second conducting zone 80. The detector element 10 does not comprise a second p/n junction J2.

The passivation layer 60 is able to electrically isolate the first barrier layer 40 from the primary electrode 55.

Preferably, the passivation layer 60 surrounds, in a plane orthogonal to the stacking direction Z and traversing the first barrier layer 40, the primary electrode 55.

The passivation layer 60 is therefore surrounded, in a plane orthogonal to the stacking direction Z, by the first conducting zone 75.

The operation of the second example is identical to the operation of the first example.

The detector element 10 then makes it possible to avoid the appearance of electric leak currents through the first conducting zone 75, the second conducting zone 80, and the primary electrode 55.

Figure 3:
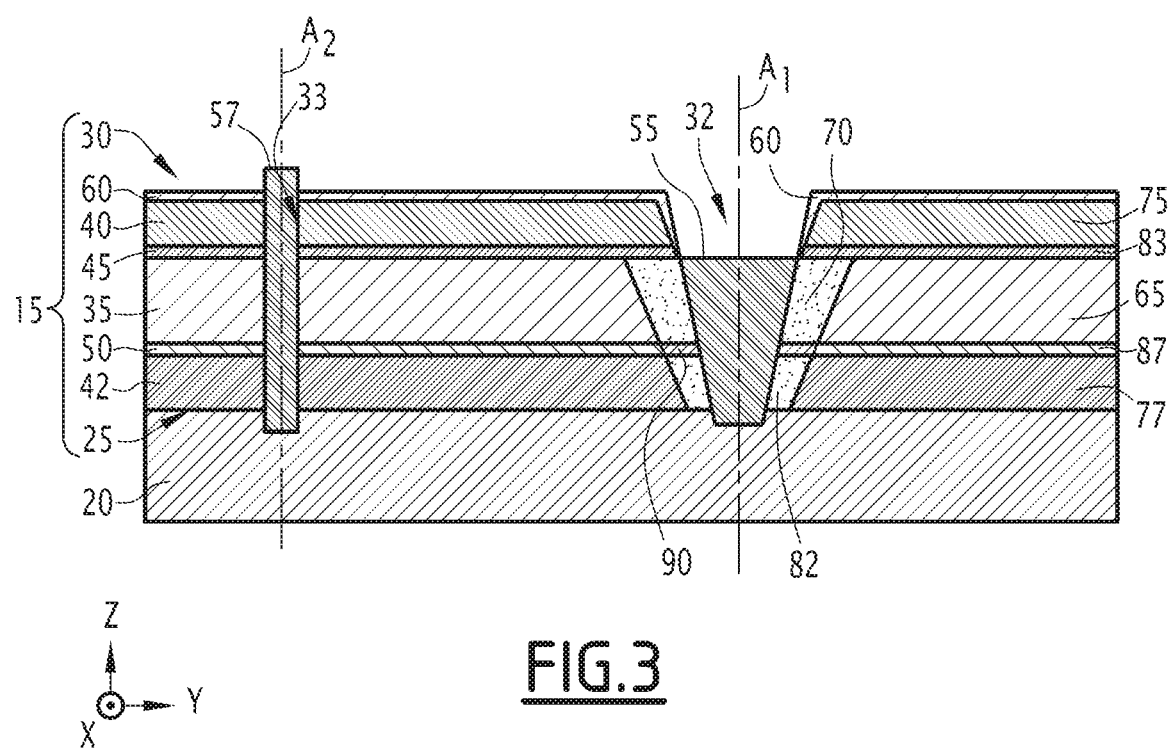

A third example detector element 10 is shown in FIG. 3. The elements identical to the first example of FIG. 1 are not described again. Only the differences are shown.

The primary hole 32 is cone-shaped with a circular base.

The primary electrode 55 traverses the second barrier layer 42, the second intermediate layer 50 and the absorbing layer 35. The primary electrode 55 does not traverse the first intermediate layer 50.

The passivation layer 60 is defined, in a plane perpendicular to the stacking direction Z, by the first barrier layer 40 and by the primary hole 32. This means that the passivation layer 60 partly covers the inner walls of the primary hole 32.

The operation of the third example is identical to the operation of the first example.

The primary electrode 55 is made easier to produce due to the conical geometry of the primary hole 32. The manufacture of the detector element 10 is therefore made easier.

Figure 4:
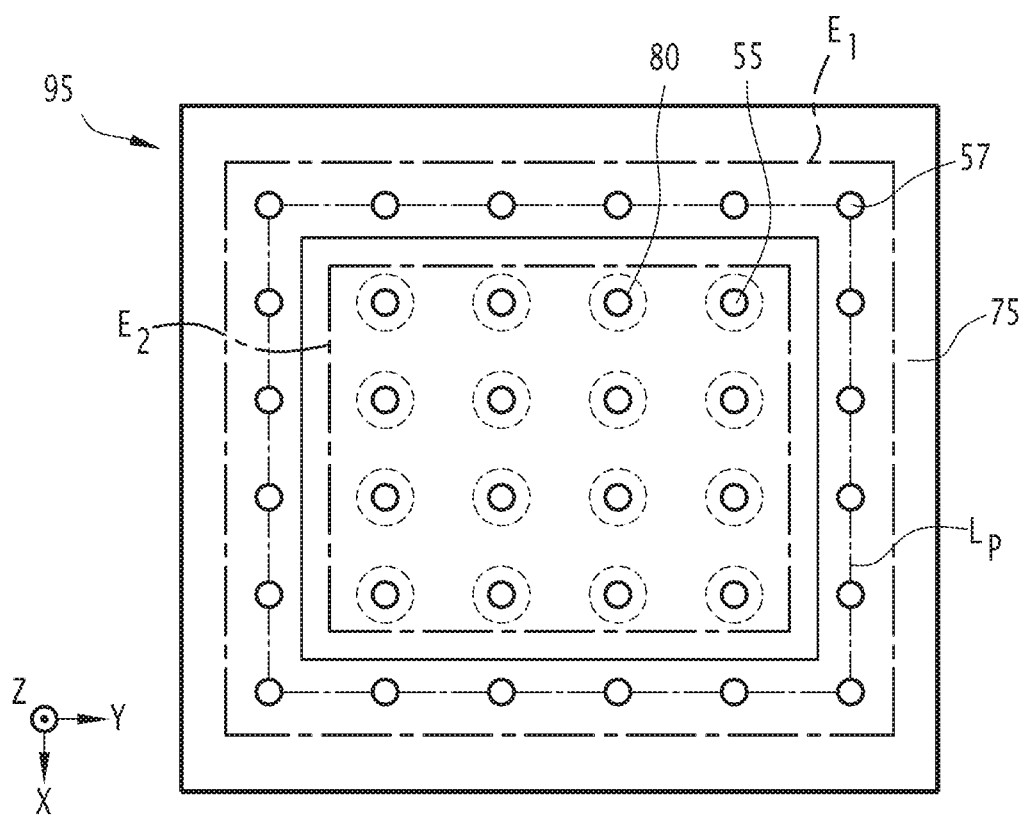
FIG. 4 is a schematic top illustration of an imager comprising a set of detector elements according to FIG. 1.

A first example imager 95 is shown in FIG. 4.

The imager 95 comprises a first set E1 of secondary holes 33 each receiving at least part of a secondary electrode 57, and a second set E2 of detector elements 10.

The detector elements 10 share a single reading circuit 20. The reading circuit 20 is configured to receive a respective electric current C from each primary electrode 55.

The reading circuit 20 is configured to generate, from each electric current C, a respective electrical signal S.

The first set E1 of secondary holes 33 has a specific line Lp. Each of the secondary holes 33 of the first set E1 is arranged along the specific line Lp.

The specific line Lp surrounds the second set E2 in a plane orthogonal to the stacking direction Z. The specific line Lp is for example rectangular.

The operation of each detector element 10 of the imager 95 is identical to the operation of the first example of FIG. 1.

In the imager 95, the secondary electrodes 57 are located outside the second set E2. The volume of the absorbing layer 35 of each detector element 10 is therefore increased. The performance of the imager 95 is then improved.

Furthermore, the electrical resistance of each detector element is decreased: the voltage U is therefore more homogeneous from one detector element 10 to the other.

Figure 5:
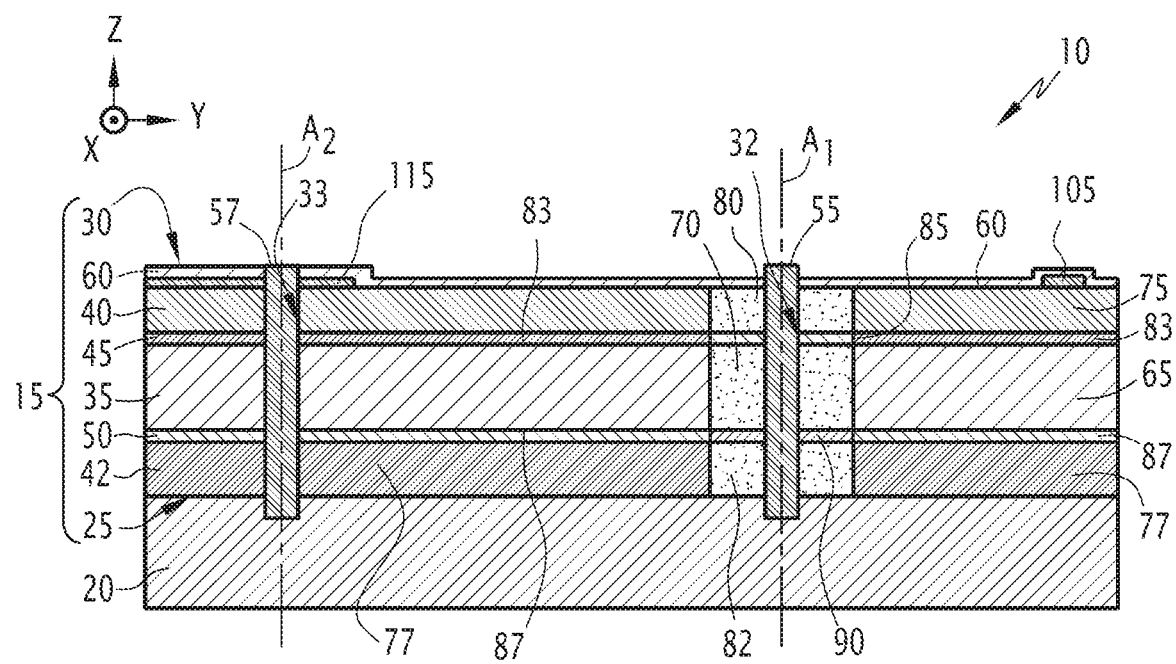
FIG. 5 is a sectional view of an alternative of the detector element of FIG. 1, FIGS. 6 and 7 are schematic top illustrations of an imager comprising a set of detector elements according to FIG. 5.

A fourth example detector element 10 is shown in FIG. 5. The elements identical to the first example of FIG. 1 are not described again. Only the differences are shown.

The third carrier density d3 is strictly less than $5.10^{16}/cm^3$. Preferably, the third carrier density d3 is equal to $2.10^{16}/cm^3$.

The second face 30 carries a band 105 made from the second material M2.

The band 105 is able to allow the passage of the electric current C between the first conducting zone 75 and the secondary electrode 57.

The band 105 has a doping of the first type.

The band 105 has an eleventh free carrier density d11. The eleventh free carrier density d11 is greater than or equal to $10^{17}/cm^3$.

Alternatively, the band 105 is made from a degenerated semiconductor material.

The band 105 is electrically connected to at least one secondary electrode 57.

The band 105 has an eighth thickness e8 in the stacking direction Z.

The eighth thickness e8 is for example comprised strictly between 500 nm and 5 µm.

The band 105 has a first width L1 in a plane perpendicular to the direction Z.

The band 105 and the first conducting zone 75 are superimposed in the stacking direction Z.

The band 105 is delimited, in the stacking direction Z, by the first conducting zone 75 and the passivation layer 60.

The band 105 is electrically connected to the first conducting zone 75.

Figure 6:
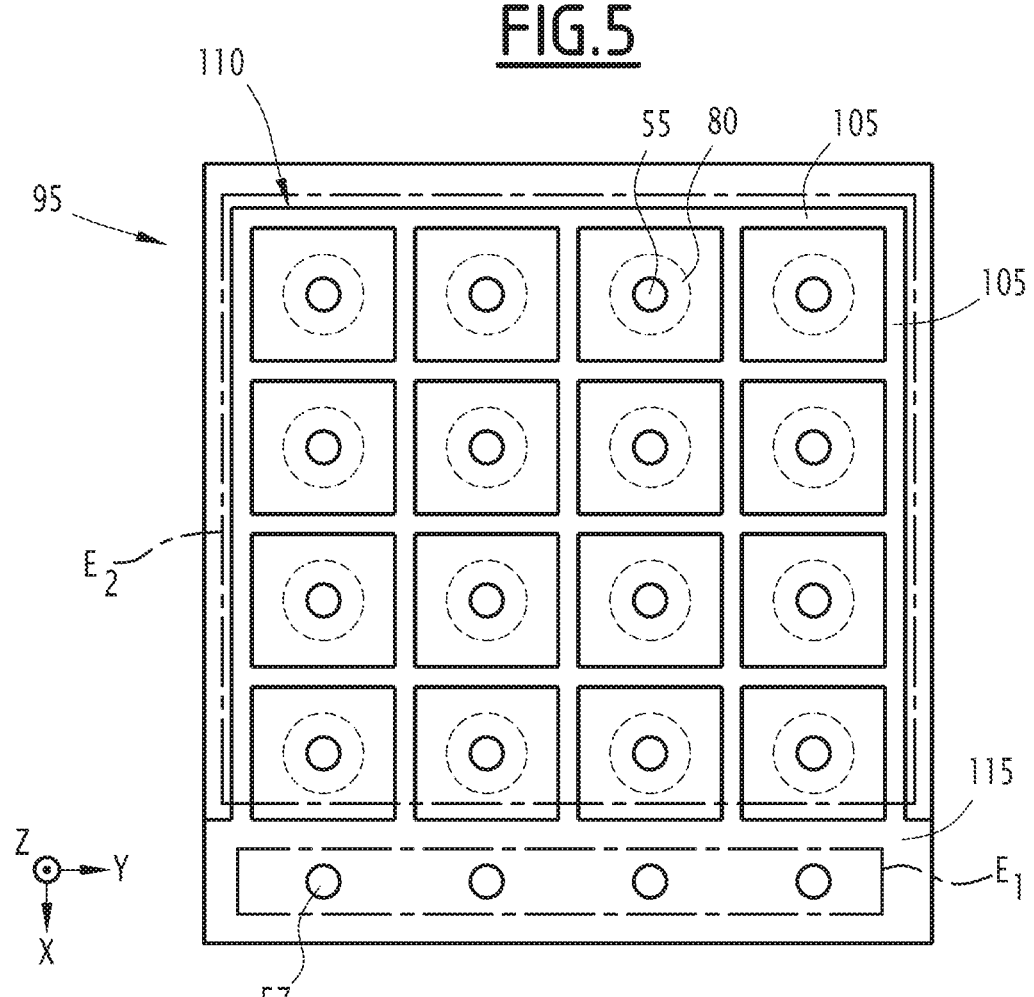

The band 105 is rectilinear, as shown in FIG. 6. The band 105 extends in a plane orthogonal to the stacking direction Z.

The passivation layer 60 is able to electrically isolate the band 105 from the outside of the stack 15. This means that the passivation layer completely covers the band 105.

The operation of the fourth example will now be described.

The electric current C successively traverses a secondary electrode 57, the band 105, the first conducting zone 75, the first intermediate zone 83, the first portion 65, the second portion 70 and the primary electrode 55.

The first conducting zone 75 has a carrier density less than or equal to $5.10^{16}/cm^3$.

The leak currents through the second p/n junction j2 are then reduced.

The performance of the detector element 10 is then improved.

Furthermore, the production of the detector element 10 is made easier.

A second example imager 95 is shown in FIG. 6. The elements identical to the first example imager of FIG. 4 are not described again. Only the differences are shown.

At least one detector element 10 is according to the fourth example detector element of FIG. 5. Preferably, each detector element 10 is according to the fourth example detector element of FIG. 5.

Each band 105 is electrically connected to at least one other band 105.

The bands 105 form a two-dimensional array 110 on the second face 30.

The array 110 has a plurality of meshes M.

Each mesh M is formed by four interlacing bands 105. This means that the four bands 105 form a closed loop on the second surface 30.

Each mesh M surrounds at least one primary electrode 55. Preferably, each mesh M surrounds a single primary electrode 55.

The array 110 is a rectangular array. This means that the bands 105 are perpendicular to one another.

"Perpendicular" means that the angle formed by two intersecting bands 105 is equal to ninety degrees, to within five degrees.

The array 110 further comprises a collection layer 115.

The collection layer 115 is able to allow the passage of the electric current C between at least one band 105 and at least one secondary electrode 57.

The collection layer 115 partly covers the second face 30. The collection layer 115 is delimited in the stacking direction Z by the second face 30.

The collection layer 115 is for example rectangular.

The collection layer 115 is planner, and extends in a plane perpendicular to the stacking direction Z.

The collection layer 115 is made from the second material M2.

The collection layer 115 has a doping of the first type.

The collection layer 115 has a twelfth free carrier density d12. The twelfth free carrier density d12 is greater than or equal to $10^{17}/cm^3$.

The collection layer 115 is electrically connected to at least one band 105. Preferably, the collection layer 115 is electrically connected to each band 105.

The collection layer 115 is electrically connected to at least one secondary electrode 57. Preferably, each secondary hole 33 of the first set E1 traverses the collection layer 115.

Each secondary electrode 57 electrically connects the collection layer 115 to the reading circuit 20.

Figure 7:
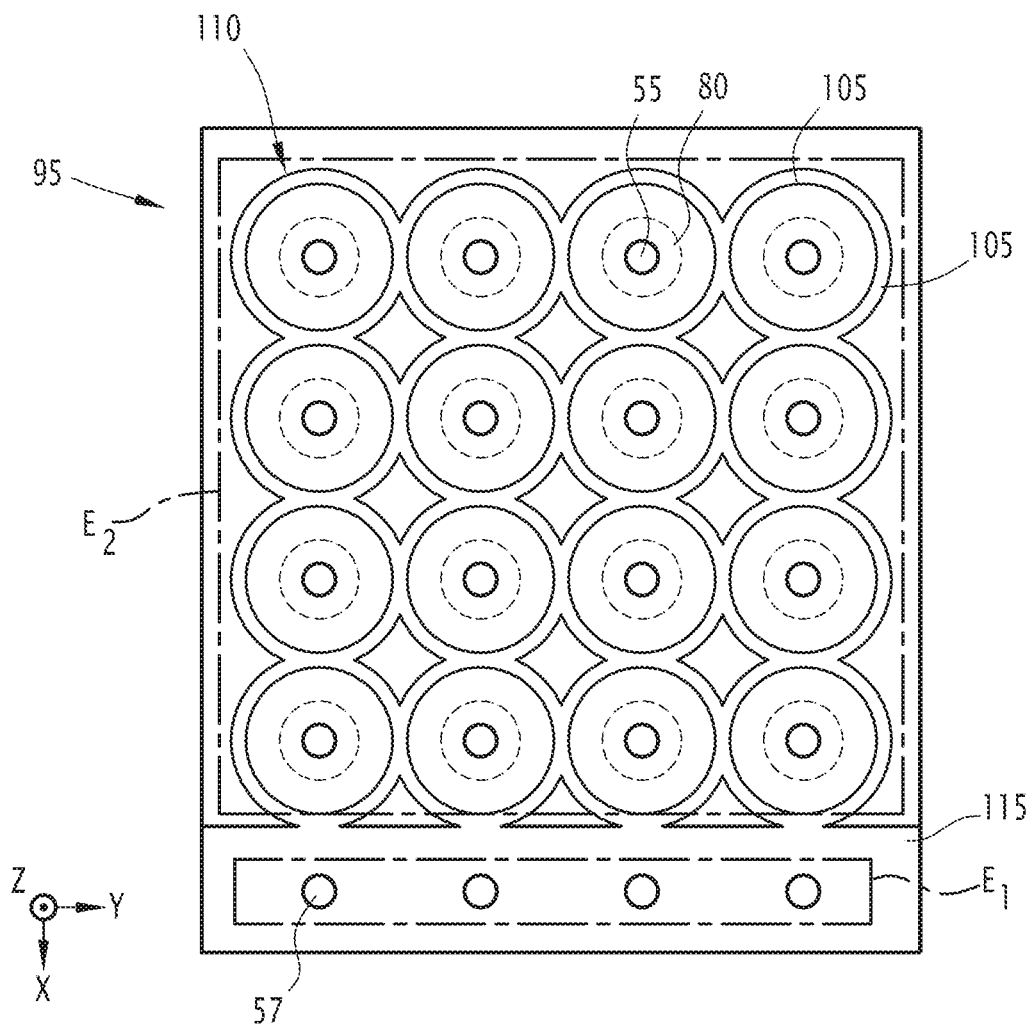

In an alternative shown in FIG. 7, the band 105 surrounds the primary electrode 55 in a plane perpendicular to the stacking direction Z. Preferably, the band 105 is made in the form of a ring with a circular base around the first axis A1.

The operation of the second example imager 95 will now be described.

The electric current C successively traverses a secondary electrode 57, the collection layer 115, at least one band 105, the first conducting zone 75, the first intermediate zone 83, the first portion 65, the second portion 70 and the primary electrode 55.

The first conducting zone 75 of each detector 10 has a carrier density less than or equal to $5.10^{16}/cm^3$. The manufacture of the imager 95 is therefore made easier.

In each of the examples given above, the first conducting zone 75 has a high electrical conductivity, of around one siemens per centimeter.

The electrical resistance of each detector element 10 is therefore decreased, and the voltage U is more homogeneous from one detector element 10 to the other. The imager 95 is therefore more precise.

Furthermore, the second face 30 does not include a metal layer. The imager 95 therefore does not have losses caused by the absorption of the radiation R by such a metal layer.

The performance of the imager 95 and detector elements 10 is therefore improved.

The invention claimed is:

1. A radiation detector element comprising:
a stack of layers superimposed in a stacking direction, the stack having a first face and a second face and comprising a radiation-absorbing layer consisting of a first semiconductor material having a first band gap value and at least one barrier layer consisting of a second semiconductor material having a second band gap value, the second band gap value being strictly greater than the first band gap value; and
a reading circuit delimited in the stacking direction by the first face;
the absorbing layer comprising a first portion having a doping of a first type chosen from among n-type doping and p-type doping, and a second portion having a doping of a second type chosen from among n-type doping and p-type doping, the second type of doping being different from the first type of doping, the first portion and the second portion forming a first p-n junction;
further delimiting a primary hole traversing each of the layers of the stack, the primary hole receiving at least part of a primary electrode electrically connecting the second portion to the reading circuit and traversing the first face, the first p-n junction surrounding the primary electrode in a plane orthogonal to the stacking direction, and
the second face carrying at least one band delimited in the stacking direction by the barrier layer, the band being made from the second semiconductor material and having a doping of the first type and a free carrier density greater than or equal to $1.10^{17}$ cm$^{-3}$.

2. The radiation detector element according to claim 1, wherein the band is made from a degenerated semiconductor material.

3. The radiation detector element according to claim 2, wherein the band surrounds the primary electrode in a plane orthogonal to the stacking direction.

4. The radiation detector element according to claim 2, wherein the stack further comprises at least one intermediate layer made from a third semiconductor material having a third band gap value comprised between the first band gap value and the second band gap value, the intermediate layer being delimited, in the stacking direction, by the absorbing layer and the barrier layer.

5. The radiation detector element according to claim 2, wherein the first material is chosen from among InGaAs, InAsSb and InSb, and
when the first material is InGaAs, the second material is InP;
when the first material is InAsSb, the second material is AlGaAsSb; and
when the first material is InSb, the second material is InAlSb.

6. The radiation detector element according to claim 2, further including a passivation layer surrounding the primary electrode in a plane orthogonal to the stacking direction, the passivation layer being delimited in the plane orthogonal to the stacking direction by the primary electrode and by the barrier layer, the passivation layer being able to electrically isolate the barrier layer from the primary electrode.

7. The radiation detector element according to claim 1, wherein the band surrounds the primary electrode in a plane orthogonal to the stacking direction.

8. The radiation detector element according to claim 7, wherein the stack further comprises at least one intermediate layer made from a third semiconductor material having a third band gap value comprised between the first band gap value and the second band gap value, the intermediate layer being delimited, in the stacking direction, by the absorbing layer and the barrier layer.

9. The radiation detector element according to claim 7, wherein the first material is chosen from among InGaAs, InAsSb and InSb, and
when the first material is InGaAs, the second material is InP;
when the first material is InAsSb, the second material is AlGaAsSb; and
when the first material is InSb, the second material is InAlSb.

10. The radiation detector element according to claim 7, further including a passivation layer surrounding the primary electrode in a plane orthogonal to the stacking direction, the passivation layer being delimited in the plane orthogonal to the stacking direction by the primary electrode and by the barrier layer, the passivation layer being able to electrically isolate the barrier layer from the primary electrode.

11. The radiation detector element according to claim 1, wherein the stack further comprises at least one intermediate layer made from a third semiconductor material having a third band gap value comprised between the first band gap value and the second band gap value, the intermediate layer being delimited, in the stacking direction, by the absorbing layer and the barrier layer.

12. The radiation detector element according to claim 11, wherein the third material is a quaternary material at least formed from the first material and the second material.

13. The radiation detector element according to claim 12, wherein the first material is chosen from among InGaAs, InAsSb and InSb, and
when the first material is InGaAs, the second material is InP;
when the first material is InAsSb, the second material is AlGaAsSb; and
when the first material is InSb, the second material is InAlSb.

14. The radiation detector element according to claim 11, wherein the first material is chosen from among InGaAs, InAsSb and InSb, and
when the first material is InGaAs, the second material is InP;
when the first material is InAsSb, the second material is AlGaAsSb; and
when the first material is InSb, the second material is InAlSb.

15. The radiation detector element according to claim 1, wherein the first material is chosen from among InGaAs, InAsSb and InSb, and
when the first material is InGaAs, the second material is InP;
when the first material is InAsSb, the second material is AlGaAsSb; and
when the first material is InSb, the second material is InAlSb.

16. The radiation detector element according to claim 1, further including a passivation layer surrounding the primary electrode in a plane orthogonal to the stacking direction, the passivation layer being delimited in the plane orthogonal to the stacking direction by the primary electrode and by the barrier layer, the passivation layer being able to electrically isolate the barrier layer from the primary electrode.

17. The radiation detector element according to claim 1, further including a filtering layer able to allow the propagation of at least one electromagnetic wave having a first energy comprised in a primary set of energies and to prevent the propagation of at least one electromagnetic wave having a second energy comprised in a secondary set of energies, the secondary set being different from the primary set, the filtering layer being delimited in the stacking direction by the second face.

18. The radiation detection element according to claim 1, wherein the primary hole is cone-shaped with a circular base.

19. An imager comprising at least one second set (E2) of radiation detector elements according to claim 1,
wherein each band is electrically connected to at least one other band, the bands forming, on the second face, a two-dimensional array having a plurality of meshes, each mesh surrounding, in a plane orthogonal to the stacking direction, a single primary electrode.

20. The imager according to claim 19, wherein the array comprises a collection layer made from the second material, and partly covering the second face, the imager further comprising a first set of secondary holes, each secondary hole traversing the collection layer and at least partially receiving a secondary electrode traversing the first face and electrically connecting the collection layer to the reading circuit.

* * * * *